US010570528B2

(12) United States Patent
Hoshikawa et al.

(10) Patent No.: US 10,570,528 B2
(45) Date of Patent: Feb. 25, 2020

(54) APPARATUS AND METHOD FOR PRODUCING GALLIUM OXIDE CRYSTAL

(71) Applicants: SHINSHU UNIVERSITY, Nagano (JP); Fujikoshi Machinery Corp., Nagano (JP)

(72) Inventors: Keigo Hoshikawa, Nagano (JP); Takumi Kobayashi, Nagano (JP); Etsuko Ohba, Nagano (JP); Jun Yanagisawa, Nagano (JP)

(73) Assignees: SHINSHU UNIVERSITY, Nagano (JP); FUJIKOSHI MACHINERY CORP., Nagano (JP)

( * ) Notice: Subject to any disclaimer, the term of this patent is extended or adjusted under 35 U.S.C. 154(b) by 24 days.

(21) Appl. No.: 15/470,547

(22) Filed: Mar. 27, 2017

(65) Prior Publication Data
US 2017/0306521 A1 Oct. 26, 2017

(30) Foreign Application Priority Data
Apr. 21, 2016 (JP) .................. 2016-085153

(51) Int. Cl.
  *C30B 11/00* (2006.01)
  *C30B 29/16* (2006.01)
  *H01L 21/02* (2006.01)

(52) U.S. Cl.
  CPC .......... *C30B 11/002* (2013.01); *C30B 11/003* (2013.01); *C30B 11/007* (2013.01);
  (Continued)

(58) Field of Classification Search
  CPC ......... H01L 21/02565; H01L 21/02625; C30B 11/002; C30B 11/003; C30B 11/007; C30B 29/16
  See application file for complete search history.

(56) References Cited

U.S. PATENT DOCUMENTS 4,144,117 A * 3/1979 Fukuda ................... C30B 15/00
  117/27
5,698,029 A * 12/1997 Fujikawa .............. C30B 11/002
  117/200
(Continued)

FOREIGN PATENT DOCUMENTS

JP   S55-071700   5/1980
JP   S59-069490   4/1984
(Continued)

OTHER PUBLICATIONS

Hoshikawa et al., Journal of Crystal Growth 447, 36-41, 2016 (Year: 2016).*

(Continued)

*Primary Examiner* — Hua Qi
(74) *Attorney, Agent, or Firm* — Stephen J. Weyer, Esq.; Stites & Harbison, PLLC (57) ABSTRACT

The apparatus for producing a gallium oxide crystal relating to the invention contains a vertical Bridgman furnace containing: a base body; a cylindrical furnace body having heat resistance disposed above the base body; a lid member occluding the furnace body; a heater disposed inside the furnace body; a crucible shaft provided vertically movably through the base body; and a crucible disposed on the crucible shaft, heated with the heater, the crucible is a crucible containing a Pt-based alloy, the furnace body has an inner wall that is formed as a heat-resistant wall containing plural ring shaped heat-resistant members each having a prescribed height accumulated on each other, and the ring shaped heat-resistant members each contain plural divided pieces that are joined to each other to the ring shape.

6 Claims, 11 Drawing Sheets

(52) U.S. Cl.
CPC ........ *C30B 29/16* (2013.01); *H01L 21/02565* (2013.01); *H01L 21/02625* (2013.01)

(56) References Cited

U.S. PATENT DOCUMENTS

| | | | |
|---|---|---|---|
| 2001/0029108 A1* | 10/2001 | Tometsuka | C23C 16/4409 438/770 |
| 2009/0025628 A1* | 1/2009 | Han | C30B 11/00 117/73 |
| 2009/0188426 A1* | 7/2009 | Lew | C30B 11/002 117/206 |
| 2010/0294198 A1* | 11/2010 | Wan | C30B 11/002 117/223 |

FOREIGN PATENT DOCUMENTS

| | | |
|---|---|---|
| JP | S63-218596 | 9/1988 |
| JP | H07-033586 | 2/1995 |
| JP | 2004-056098 | 2/2004 |
| JP | 2004262684 | 9/2004 |
| JP | 2006312571 | 11/2006 |
| JP | 2011153054 | 8/2011 |
| JP | 2011190127 | 9/2011 |
| JP | 2011190134 | 9/2011 |
| JP | 2013-103863 | 5/2013 |
| JP | 2013237591 | 11/2013 |

OTHER PUBLICATIONS

Ueda, Naoyuki, Hideo Hosono, Ryuta Waseda, and Hiroshi Kawazoe. "Synthesis and Control of Conductivity of Ultraviolet Transmitting $\beta$-$Ga_2O_3$ Single Crystals." Applied Physics Letters 70.26 (1997): 3561-563. Web.

Vasyltsiv, V. I., Rym, Ya. I. and Zakharko, Ya. M. (1996), Optical absorption and photoconductivity at the band edge of $\beta$-$Ga_{2-x}In_xO_3$. Phys. Status Solidi B, 195: 653-658. doi: 10.1002/pssb.2221950232.

Tomm, Y., J.m Ko, A. Yoshikawa, and T. Fukuda. "Floating Zone Growth of $\beta$-$Ga_2O_3$: A New Window Material for Optoelectronic Device Applications." Solar Energy Materials and Solar Cells 66.1-4 (2001): 369-374. Web.

Tomm, Y., P. Reiche, D. Klimm, and T. Fukuda. "Czochralski Grown $Ga_2O_3$ Crystals." Journal of Crystal Growth 220.4 (2000): 510-514. Web.

Villora G., Encarnación, Kiyoshi Shimamura, Yukio Yoshikawa, Kazuo Aoki, and Noboru Ichinose. "Large-size $\beta$-$Ga2_2O_3$ Single Crystals and Wafers." Journal of Crystal Growth 270.3-4 (2004): 420-426. Web.

Zinkevich, Matvei, and Fritz Aldinger. "Thermodynamic Assessment of the Gallium-Oxygen System." Journal of the American Ceramic Society 87.4 (2004): 683-691. Web.

Zhang, Jungang, Bin Li, Changtai Xia, Guangqing Pei, Qun Deng, Zhaohui Yang, Wusheng Xu, Hongsheng Shi, Feng Wu, Yongqing Wu, and Jun Xu. "Growth and Spectral Characterization of $\beta$-$Ga_2O_3$ Single Crystals." Journal of Physics and Chemistry of Solids 67.12 (2006): 2448-2451. Web.

Zhang, Jungang, Changtai Xia, Qun Deng, Wusheng Xu, Hongsheng Shi, Feng Wu, and Jun Xu. "Growth and Characterization of New Transparent Conductive Oxides Single Crystals $\beta$-$Ga_2O_3$: Sn." Journal of Physics and Chemistry of Solids 67.8 (2006): 1656-1659. Web.

Aida, Hideo, Kengo Nishiguchi, Hidetoshi Takeda, Natsuko Aota, Kazuhiko Sunakawa, and Yoichi Yaguchi. "Growth of $\beta$-$Ga_2O_3$ Single Crystals by the Edge-Defined, Film Fed Growth Method." Japanese Journal of Applied Physics 47.11 (2008): 8506-8509. Print.

Galazka, Z., R. Uecker, K. Irmscher, M. Albrecht, D. Klimm, M. Pietsch, M. Brützam, R. Bertram, S. Ganschow, and R. Fornari. "Czochralski Growth and Characterization of $\beta$-$Ga_2O_3$ Single Crystals." Crystal Research and Technology 45.12 (2010): 1229-1236. Web.

Higashiwaki, Masataka, Kohei Sasaki, Akito Kuramata, Takekazu Masui, and Shigenobu Yamakoshi. "Gallium Oxide ($Ga_2O_3$) Metal-semiconductor Field-effect Transistors on Single-crystal $\beta$-$Ga_2O_3$ (010) Substrates." Applied Physics Letters 100.1 (2012): 013504. Web.

* cited by examiner

FIG.1

High temperature volatilization loss amounts
in the air of Pt group elements

Alumina board (RF1800)
dotted line: sapphire tube

Crystal A	Crystal B	Crystal C

FZ method    CZ method    EFG method    VB method    HB method

APPARATUS AND METHOD FOR PRODUCING GALLIUM OXIDE CRYSTAL

CROSS-REFERENCE TO RELATED APPLICATION

This application is based upon and claims the benefit of priority of the prior Japanese Patent Application No. 2016-085153, filed on Apr. 21, 2016, and the entire contents of which are incorporated herein by reference.

TECHNICAL FIELD

The present invention relates to an apparatus and a method for producing a gallium oxide crystal, which is a wide gap semiconductor for a power device that is positioned as a post-silicon crystal material.

BACKGROUND ART

A single crystal of gallium oxide (particularly a β-$Ga_2O_3$ single crystal, the following description will refer to a β-$Ga_2O_3$ single crystal) has been studied and developed initially for crystal growth thereof as a substrate for producing a GaN thin film for LED since the reports of single crystal growth by the FZ method or the CZ method by Y. Tomm, et al. in 2000 (NPLs 3 and 4).

In recent years, M. Higashiwaki, et al, reported the implementation of an FET for a power device using a β-$Ga_2O_3$ single crystal (see NPL 11), and the production of a β-$Ga_2O_3$ single crystal with high quality, large size, and low cost for achieving a wide gap semiconductor substrate for a power device is receiving intense interest.

Figure 18:
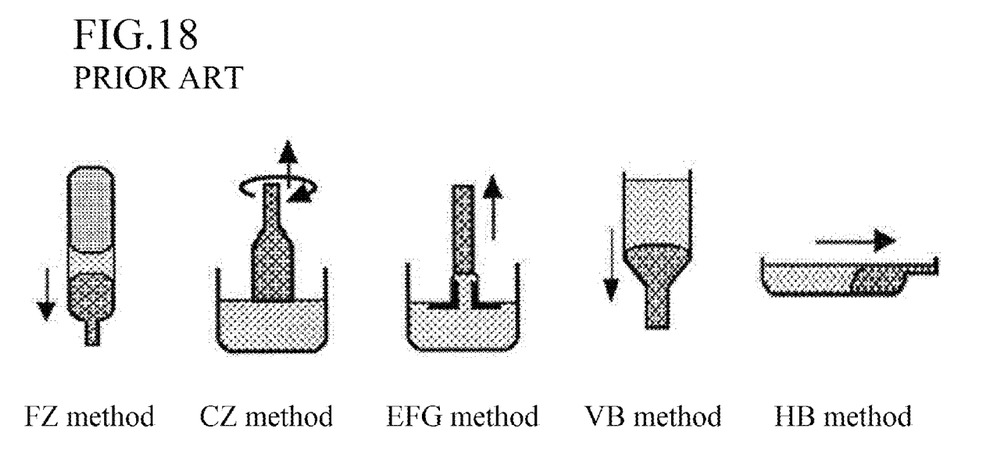
FIG. 18 is an illustration showing the crystal growth methods (i.e., the FZ method, the CZ method, the EFG method, the VB method, and the HB method).

It is considered that a β-$Ga_2O_3$ single crystal taking the application to devices into account can be grown by such methods as the floating zone (FZ) method, the CZ method, the EFG method, the VB method, and the HB method, as shown in FIG. 18.

Among these crystal growth methods, the FZ method requires no vessel for retaining a raw material melt due to the crystal growth principle, and therefore the measure for heating the raw material to a high temperature for melting (melting point) can be relatively easily achieved, for which various studies have been made (see NPLs 1 to 3, 5, 7, and 8). However, the FZ method has a technical limitation in providing a large crystal with high quality suppressing structural defects including dislocations, in consideration of the growth principle and the temperature environment thereof, and it can be said that the FZ method does not sufficiently measure up the application to devices although various investigations have been made in recent more than ten years (see NPLs 1 to 3, 5, 7, and 8 and PTL 6).

As a production method of a large single crystal with high quality, capable of being applied to industrial production, the CZ method and the EFG method have been frequently applied to the single crystal growth. As for the growth of a β-$Ga_2O_3$ single crystal, it can be expected that active developments have been made since 2000 for the CZ method (see NPLs 4 and 10) and the EFG method (NPL 9 and PTLs 1 to 5). However, a β-$Ga_2O_3$ single crystal that has large size and high quality, and is produced at low cost capable of being applied to the future power devices has not yet been provided.

CITATION LIST

Patent Literature

PTL 1: JP-A-2013-237591
PTL 2: JP-A-2011-190134
PTL 3: JP-A-2011-190127
PTL 4: JP-A-2011-153054
PTL 5: JP-A-2006-312571
PTL 6: JP-A-2004-262684

Non Patent Literature

NPL 1: N. Ueda, H. Hosono, R. Waseda, H. Kawazoe, Appl. Phys. Lett., 70 (1997) 3561.
NPL 2: V. I. Vasyltsiv, Ya. I. Rym, Ya. M. Zakharo, Phys. Stat. Sol., B195 (1996) 653.
NPL 3: Y Tomm, J. M. Ko, A. Yoshikawa, T. Fukuda, Solar Energy mater. Solar Cells, 66 (2000) 369.
NPL 4: Y. Tomm et. al; Czochralski grown $Ga_2O_3$ crystals, Journal of Crystal Growth, 220 (2000) 510-514.
NPL 5: E. G. Villora et al.; Large-size β-$Ga_2O_3$ single crystals and wafers, Journal of Crystal Growth, 270 (2004) 420-426.
NPL 6: M. Zinkevich et al.; Thermodynamic Assessment of the Gallium-Oxygen System, J. Am. Ceram. Soc., 87 [4] 683-91 (2004).
NPL 7: J. Zhanga et al.; Growth and spectral characterization of β-$Ga_2O_3$ single crystals, Journal of Physics and Chemistry of Solids, 67 (2006) 2448-2451.
NPL 8: J. Zhanga et al.; Growth and characterization of new transparent conductive oxides single crystals β-$Ga_2O_3$: Sn, Journal of Physics and Chemistry of Solids, 67 (2006) 1656-1659.
NPL 9: H. AIDA et al.; Growth of β-$Ga_2O_3$ Single Crystals by the Edge-Defined, Film Fed Growth Method, Japanese Journal of Applied Physics, Vol. 47, No. 11, 2008, pp. 8506-8509.
NPL 10: Z. Galazka et al.; Czochralski growth and characterization of β-$Ga_2O_3$ single crystals, Cryst. Res. Technol., 45, No. 12 (2010) 1229-1236.
NPL 11: M. Higashiwaki et al.; Gallium oxide ($Ga_2O_3$) metal-semiconductor field-effect transistors on single-crystal β-$Ga_2O_3$ (010) substrates, Appl. Phys. Lett., 100, (2012) 013504.

SUMMARY OF INVENTION

Technical Problem

In the case where crystal growth is performed by the CZ method and the EFG method, a crucible for retaining a raw material melt is necessarily used. Since β-$Ga_2O_3$ has a high melting point of approximately 1800° C., examples of the material that is considered to be applied to the crucible material include high melting point metals, such as Ir, Mo, and W.

However, it has been known that Mo and W are clearly not suitable for a crucible since in the case where β-$Ga_2O_3$ is melted in a crucible of Mo or W under a high temperature exceeding 1800° C., Mo or W as the crucible material decomposes β-$Ga_2O_3$ through withdrawal of oxygen therefrom and is oxidized due to the large reducing power of Mo and W. Consequently, it has been recognized that Ir is the only high melting point metal that is capable of being applied to the material of the crucible for the CZ method and the crucible and the die for the EFG method. This can be also recognized from the fact that all the crucible materials applied to the CZ method (NPLs 4 and 10) and the EFG method (NPL 9) in the reference literatures are Ir.

However, the present inventors have clarified by various experiments and theoretical consideration that Ir having been applied to the crucible material for the CZ method and the crucible material (including the die material) for the EFG method still has a significant problem.

Specifically, it has been found that Ir undergoes oxidation reaction under an oxygen partial pressure exceeding several percent in a high temperature furnace exceeding 1800° C., and is difficult to use as a stable crucible material. It has also found that β-$Ga_2O_3$ undergoes decomposition reaction losing oxygen under an oxygen partial pressure of 10% or less at a high temperature exceeding 1800° C., and is difficult to be present as a stable β-$Ga_2O_3$ melt.

It is clear from the above that the oxygen partial pressure condition in a high temperature furnace that is required for β-$Ga_2O_3$ as the raw material melt contradicts the oxygen partial pressure condition that is required for the Ir crucible retaining the raw material melt. Consequently, it is recognized that Ir cannot be a suitable crucible material for housing a β-$Ga_2O_3$ raw material melt.

In addition, even though the β-$Ga_2O_3$ crystal growth by the CZ method and the EFG method using an Ir crucible can be performed under the narrow range of the oxygen partial pressure in the furnace, it has been experimentally clarified that the β-$Ga_2O_3$ crystal thus grown has problems including high density oxygen defects, which often occur in an oxide crystal grown under insufficient oxygen, and the evaporation loss and the deterioration caused by oxidation of Ir. Furthermore, there are various problems in achieving a semiconductor device, for example, the oxygen defects affect the n-type impurity to form the donor in a high concentration, so as to be considerably difficult to achieve p-type β-$Ga_2O_3$.

Solution to Problem

The present invention has been accomplished to solve the problems, and an object thereof is to provide an apparatus and a method for producing a gallium oxide crystal that are capable of providing a gallium oxide crystal having large size and high quality positioned as a post-silicon crystal material as a wide gap semiconductor material essential for the future power device production.

The invention relates to an apparatus for producing a gallium oxide crystal, containing a vertical Bridgman furnace containing: a base body; a cylindrical furnace body having heat resistance disposed above the base body; a lid member occluding the furnace body; a heater disposed inside the furnace body; a crucible shaft provided vertically movably through the base body; and a crucible disposed on the crucible shaft, heated with the heater, the crucible being a crucible containing a Pt-based alloy, the furnace body having an inner wall that is formed as a heat-resistant wall containing plural ring shaped heat-resistant members each having a prescribed height accumulated on each other, the ring shaped heat-resistant members each containing plural divided pieces that are joined to each other to the ring shape.

The crucible may be a crucible containing a Pt—Rh-based alloy having a Rh content of from 10 to 30 wt %.

The heat-resistant wall preferably contains zirconia.

The heater used may be a resistance heater or a high-frequency induction heater. Examples of the resistance heater include a resistance heater containing $MoSi_2$ as a major material, and examples of the high-frequency induction heater include a heater containing a Pt—Rh-based alloy.

The furnace body may contain a supporting cylinder member formed of a heat-resistant material and disposed outside the heat-resistant wall, and a thermal insulator disposed between the heat-resistant wall and the supporting cylinder member, and the lid member may be supported by the supporting cylinder member.

The lid member may contain a thermal insulator, and a reinforcing member may be disposed in the thermal insulator.

In the invention as described above, as a crucible vessel for growing a gallium oxide crystal at a high temperature of the melting point of gallium oxide or more under an oxygen atmosphere, a Pt-based alloy crucible is used instead of Ir.

Figure 1:
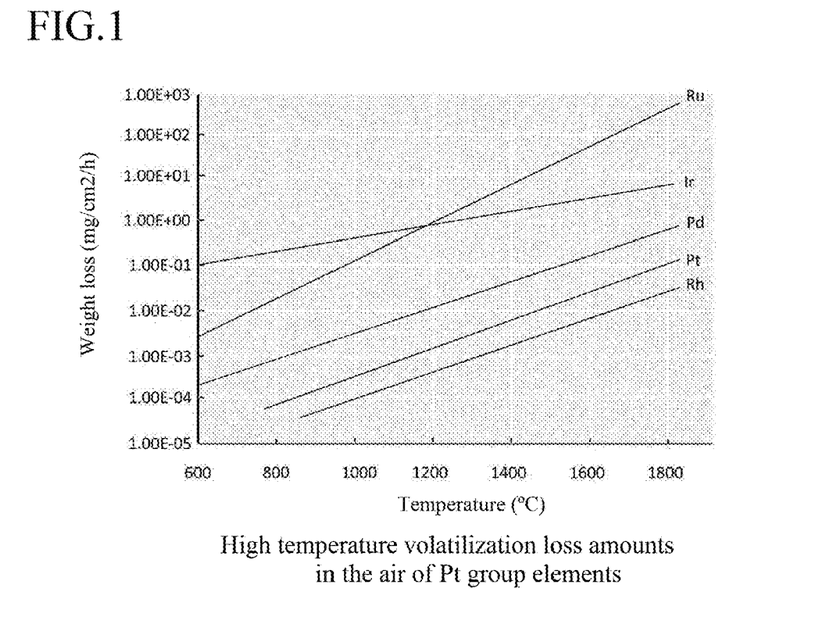
FIG. 1 is a graph showing the high temperature volatilization loss amounts in the air of the Pt group elements in a high temperature range.

FIG. 1 shows the high temperature volatilization loss amounts in the air of the Pt group elements capable of being used as a crucible material at a high temperature of the melting point of gallium oxide (β-$Ga_2O_3$) or more. The data shown in FIG. 1 is based on the known data.

The inventors have found based on the known data and the results of the precise melting experiments and the precise crystal growth experiments of β-$Ga_2O_3$ performed by the inventors that a platinum-based alloy, particularly an alloy of platinum (Pt) and rhodium (Rh), is suitable for a material of a crucible used for producing a β-$Ga_2O_3$ crystal.

Figure 2:
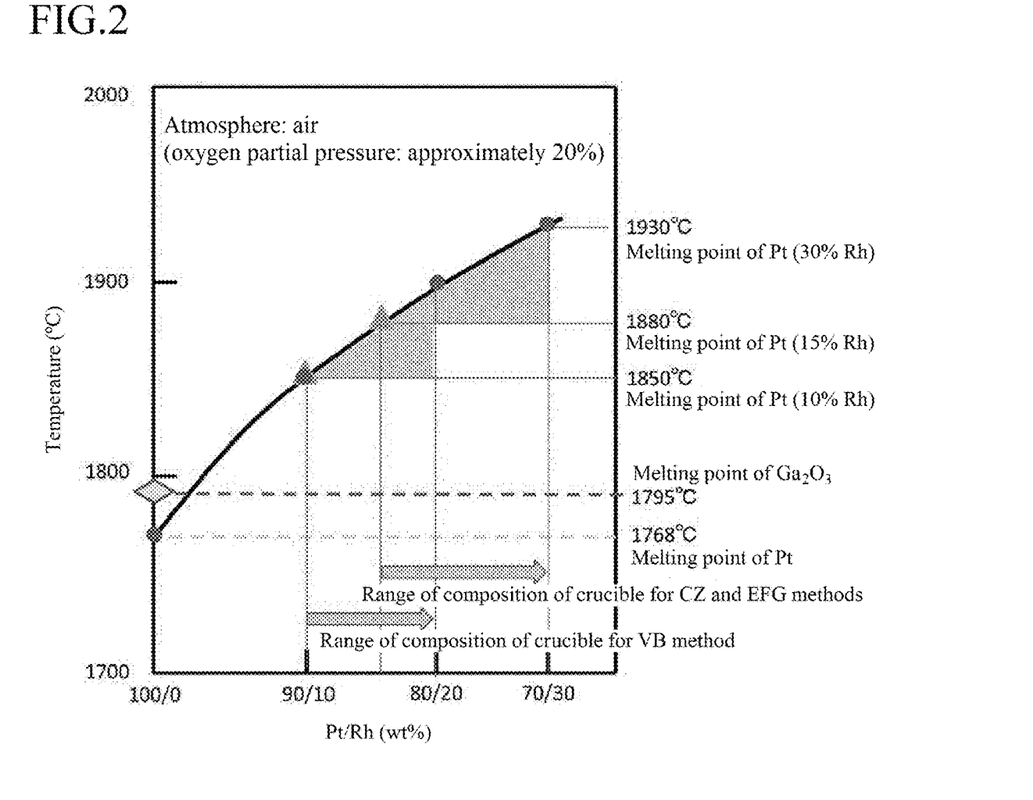
FIG. 2 is a graph showing the relationship between the composition of the Pt—Rh alloy (wt %) and the melting point, provided based on the data of the known literatures and the experimental data by the inventors.

A Pt—Rh alloy has various melting point depending on the content of Rh contained in Pt. FIG. 2 shows the relationship between the composition of the Pt—Rh alloy (wt %) and the melting point, provided based on the data of the known literatures and the experimental data by the inventors.

The experiment for measuring the melting point of the Pt—Rh alloy is performed in the air (with an oxygen partial pressure of approximately 20%), and it has been confirmed that the results shown in FIG. 2 are not largely changed even in an argon (Ar) atmosphere having an oxygen partial pressure of from 10 to 50% and a nitrogen ($N_2$) atmosphere having an oxygen partial pressure of from 10 to 20%.

According to the melting experiment of β-$Ga_2O_3$ by the inventors, β-$Ga_2O_3$ is completely melted at approximately 1795° C. Accordingly, Pt having a melting point of 1768° C. clearly cannot be used as a material of a crucible for melting and retaining β-$Ga_2O_3$. However, a Pt—Rh alloy containing approximately 2 wt % or more of Rh has a melting point that exceeds the melting point of β-$Ga_2O_3$, and thus theoretically can be used as a crucible for retaining a melt of β-$Ga_2O_3$.

In the practical crystal growth of β-$Ga_2O_3$, the melting point of the Pt—Rh alloy crucible required for stably retaining a β-$Ga_2O_3$ melt having a melting point of approximately 1795° C. and for performing crystal growth thereof varies depending on the principle of the crystal growth, the size of the crystal to be grown, the crystal growth conditions, and the like.

In the β-$Ga_2O_3$ crystal growth by the VB (vertical Bridgman) method, it has been found that the lower limit of the Rh content in the applicable Pt—Rh alloy crucible is necessarily 10 wt % or more, and the crucible has a melting point of 1850° C. or more. Assuming the growth of a crystal having a diameter of 100 mm, it has been found that the Rh content suffices to be approximately 20 wt %, and the crucible suffices to have a melting point of approximately 1900° C. A Pt—Rh alloy crucible may have a problem of elution of Rh when the Rh content is too large, and thus the Rh content is preferably 30 wt % or less.

FIG. 2 shows the aforementioned experimentally and empirically obtained range of the composition of the Pt—Rh alloy of the crucible applied to the VB method.

The difference of the melting point of the crucible that is necessary for achieving the stable crystal growth process by preventing the crucible from suffering such problems as local deterioration or melting and overall melting characterizes each of the crystal growth methods, and in particular, the fact that the Rh content of the Pt—Rh alloy of the crucible applied to the VB method is smaller than the Rh content of the crucible applied to the CZ method and the EFG method relates to the fact that the VB method is the crystal growth method not required to control the diameter of the crystal, and thus can be said to be an appropriate result.

According to the method and apparatus for producing a gallium oxide ($\beta$-$Ga_2O_3$) crystal of the invention, the necessary and sufficient oxygen partial pressure required from the view point of the crystal growth condition and the characteristics of the grown crystal (i.e., an oxygen partial pressure of from 10 to 50%) can be applied, and thus the occurrence of oxygen defects in the crystal, which is a significant problem in the crystal growth method using the ordinary Ir crucible, can be considerably decreased, thereby providing a single crystal with high quality.

Advantageous Effects of Invention

According to the method and apparatus for producing a gallium oxide crystal of the invention, a gallium oxide (particularly $\beta$-$Ga_2O_3$) crystal can be favorably grown under an oxygen atmosphere by applying a crucible containing a Pt-based alloy, and a gallium oxide crystal having large size and high quality with less defects can be produced. In the case where the inner wall of the furnace body is formed as a heat-resistant wall containing plural ring shaped heat-resistant members each having a prescribed height accumulated on each other, and the ring shaped heat-resistant members each contain plural divided pieces that are joined to each other to the ring shape, the thermal expansion and contraction can be absorbed thereby, and an apparatus for producing a gallium oxide crystal excellent in durability can be provided.

BRIEF DESCRIPTION OF DRAWINGS

FIGS. 16A, 16B, 16C, and 16D are photographs showing the results of the crossed nicols observation, the X-ray topography observation, and the optical microscope observation of the double-sided mirror polished substrate wherein FIG. 16C is an enlargement of area C of FIG. 16B and FIG. 16D is an enlargement of area D of FIG. 16B.

DESCRIPTION OF EMBODIMENTS

Example of Production Apparatus

In the apparatus for producing a gallium oxide ($\beta$-$Ga_2O_3$) crystal according to the embodiment of the invention, as the crucible material used for growing the $\beta$-$Ga_2O_3$ crystal, a crucible material that is different from Ir, specifically a platinum-based alloy, and preferably an alloy material of platinum (Pt) and rhodium (Rh), is used.

Figure 3:
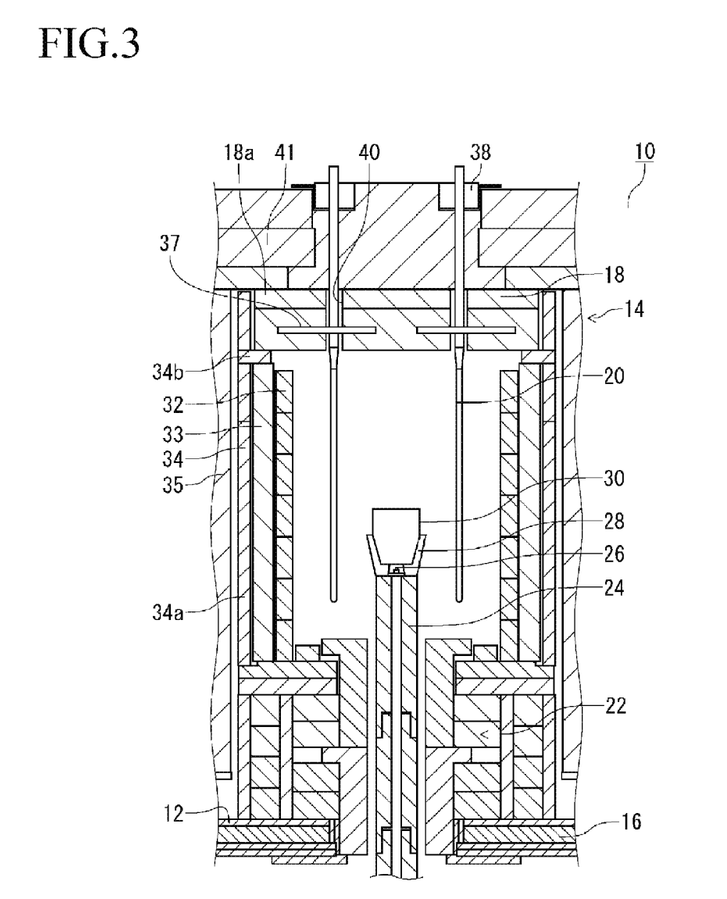
FIG. 3 is a cross sectional view showing an example of the structure of the apparatus for producing a gallium oxide crystal.

FIG. 3 shows an example of an apparatus 10 for producing a gallium oxide crystal for growing a $\beta$-$Ga_2O_3$ crystal. The apparatus 10 for producing a gallium oxide crystal is an apparatus for growing a $\beta$-$Ga_2O_3$ crystal by the VB (vertical Bridgman method) in an oxygen atmosphere (i.e., in the air).

The example of the apparatus 10 for producing a gallium oxide crystal will be schematically described.

In FIG. 3, a furnace body 14 is disposed above a base body (pedestal) 12. The base body 12 has a cooling mechanism 16 provided therein, through which cooling water is made to flow.

The furnace body 14 has a cylindrical shape in total and is formed to have a structure that has heat resistance withstanding a high temperature up to approximately 1850° C.

The furnace body 14 has an opening that can be occluded with a lid member 18. The furnace body 14 has a bottom portion 22 containing various heat-resistant materials accumulated in the lower part thereof A heater 20 is disposed inside the furnace body 14. The heater in this embodiment is a resistance heater, which emits heat on application of electricity.

The bottom portion 22 and the base body 12 have a through hole penetrating in the vertical direction, and a crucible shaft 24 is disposed through the through hole, vertically movably and rotatably with an axis thereof as center with a driving mechanism, which is not shown in the figure. The crucible shaft 24 is also formed of a heat-resistant material withstanding a high temperature, such as alumina. A thermocouple 26 is disposed inside the crucible shaft 24, with which the temperature in the furnace body 14 can be measured.

An adapter 28 formed of a heat-resistant material, such as zirconia, is mounted at the upper end of the crucible shaft 24, and a crucible 30 formed of the Pt—Rh alloy is to be placed in the adapter 28. The crucible 30 is heated with the heater 20.

Subsequently, the portions of the apparatus will be described in detail.

In the embodiment shown in the figure, the furnace body 14 has a four-layer structure containing a heat-resistant wall 32 as the innermost wall, a thermal insulator layer 33, a supporting cylinder member 34, and a thermal insulator layer 35 in this order from the inner layer. The outer side of the thermal insulator layer 35 is covered with an outer wall, which is not shown in the figure.

Figure 4:
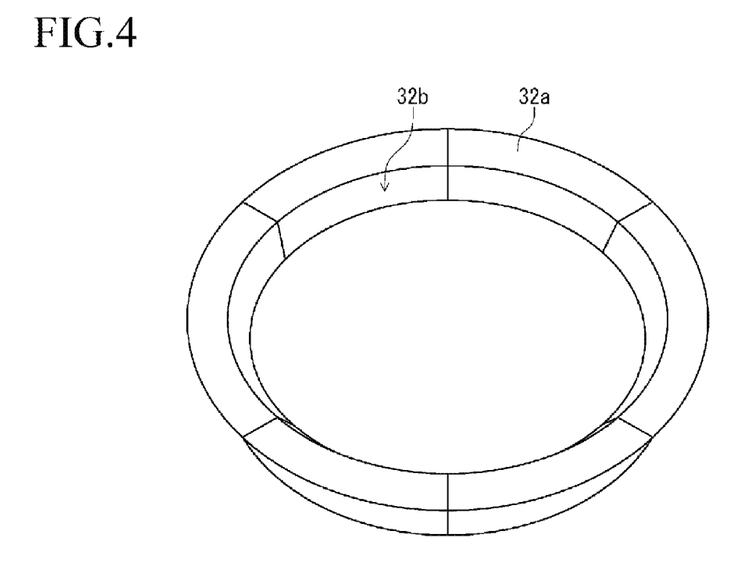
FIG. 4 is a perspective view showing an example of the ring shaped heat-resistant member.
Figure 5:
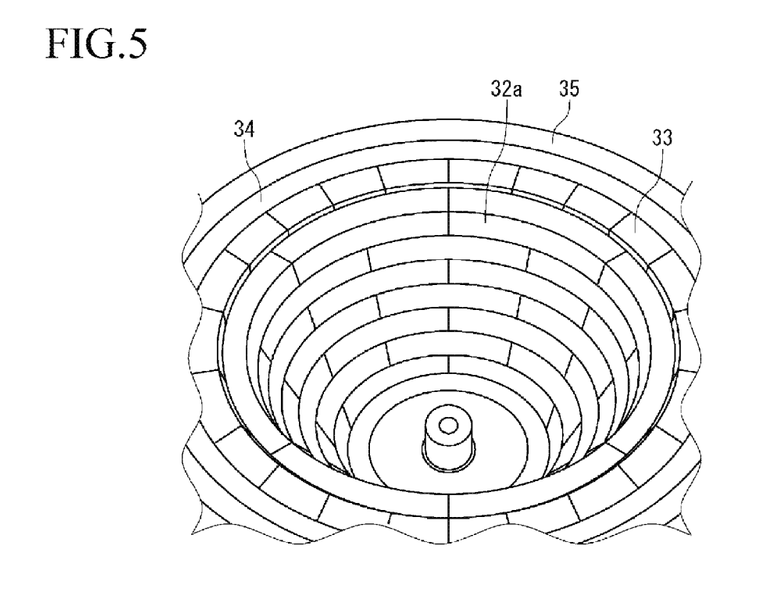
FIG. 5 is a perspective view showing an example of the furnace body.

As shown in FIGS. 4 and 5, the heat-resistant wall 32 is formed to have a cylinder shape by vertically accumulating plural heat-resistant members 32b, each of which contains six divided pieces 32a that are joined to each other to the ring shape having a prescribed height. The heat-resistant members 32b formed to the ring shape are preferably disposed by accumulating in such a manner that the divided pieces 32a of the heat-resistant members 32b adjacent in the vertical direction to each other are shifted from each other in the circumferential direction as is clear from FIG. 5.

The heat-resistant member 32b is not particularly limited, and is preferably formed of alumina, or zirconia having heat resistance to a temperature up to approximately 2000° C.

The supporting cylinder member 34 is disposed outside the heat-resistant wall 32 with a distance to the heat-resistant wall 32. The supporting cylinder member 34 is also formed to have a cylinder shape by accumulating plural ring-shaped members 34a each having a prescribed height. The ring-shaped members 34a adjacent in the vertical direction to each other are preferably fixed with an appropriate connecting member, which is not shown in the figure. A supporting ring 34b having portions protruding inward is mounted on an upper part of the supporting cylinder member 34, and the lid member 18 is supported by the supporting ring 34b.

The supporting cylinder member 34 functions as a mechanical structure, and is preferably formed of alumina, which has heat resistance and simultaneously is excellent in strength.

The thermal insulator layer 33 is disposed between the heat-resistant wall 32 and the supporting cylinder member 34. The thermal insulator layer 33 contains alumina fibers that are aggregated to a prescribed density, and is formed to have a porous nature, to have heat resistance, and to have thermal insulating property.

The thermal insulator layer 35 disposed outside the supporting cylinder member 34 is formed by filling alumina fibers.

The lid member 18 contains a necessary number of boards 18a accumulated, each of which contains alumina fibers that are aggregated to a prescribed density, as similar to the thermal insulator layer 33. Accordingly, the lid member 18 is lightweight, and a reinforcing member 37 formed of a sapphire tube or the like having heat resistance is inserted into the accumulated boards for reinforcing the strength.

While the lid member 18 may be considered to be formed of zirconia or alumina having a large density, the apparatus 10 for producing a gallium oxide crystal according to the embodiment is heated to a high temperature of 1800° C. or more in the interior thereof, and thus may not withstand the weight of itself with the lid member formed of zirconia or alumina having a large density, so as to cause a problem including deformation. The problem can be solved by using the lightweight lid member 18 formed of aggregated alumina fibers, and compensating the shortage in strength with the reinforcing member 37.

Figure 6:
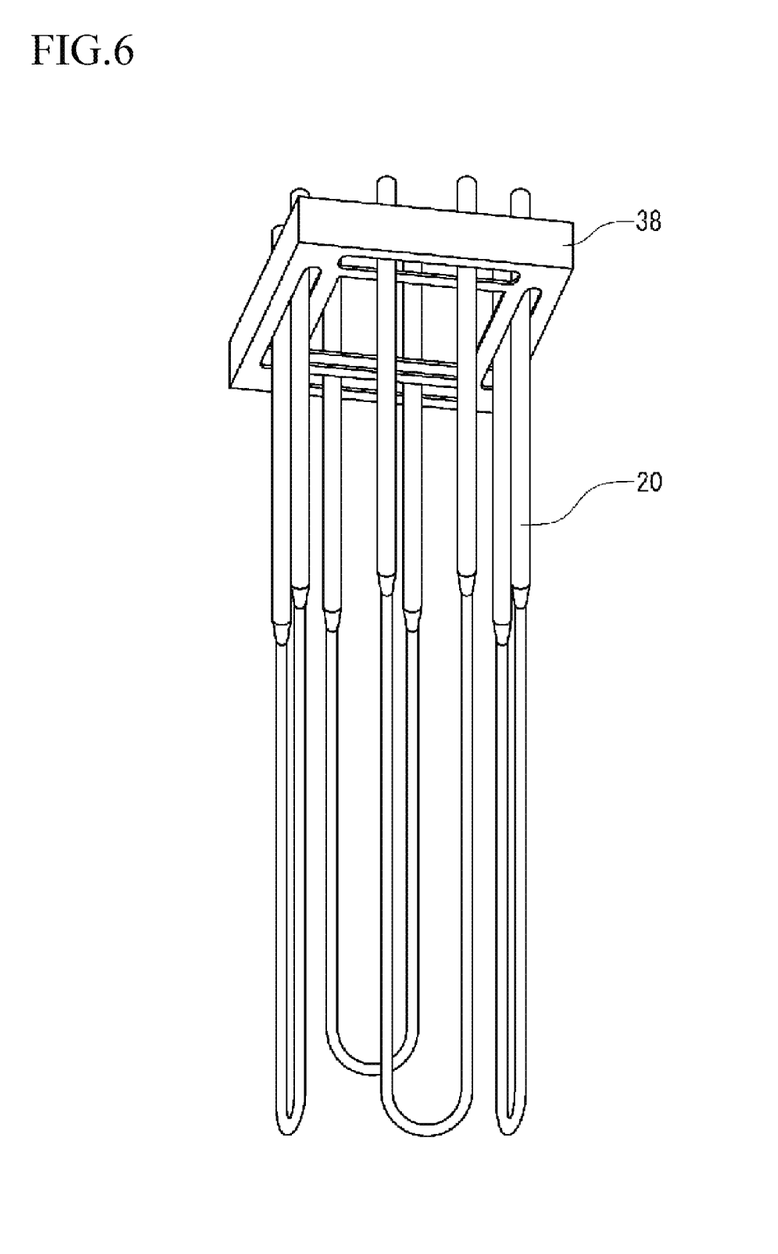
FIG. 6 is a perspective view showing an example of the heater.

FIG. 6 is a perspective view showing a specific structure of the heater 20.

Figure 7:
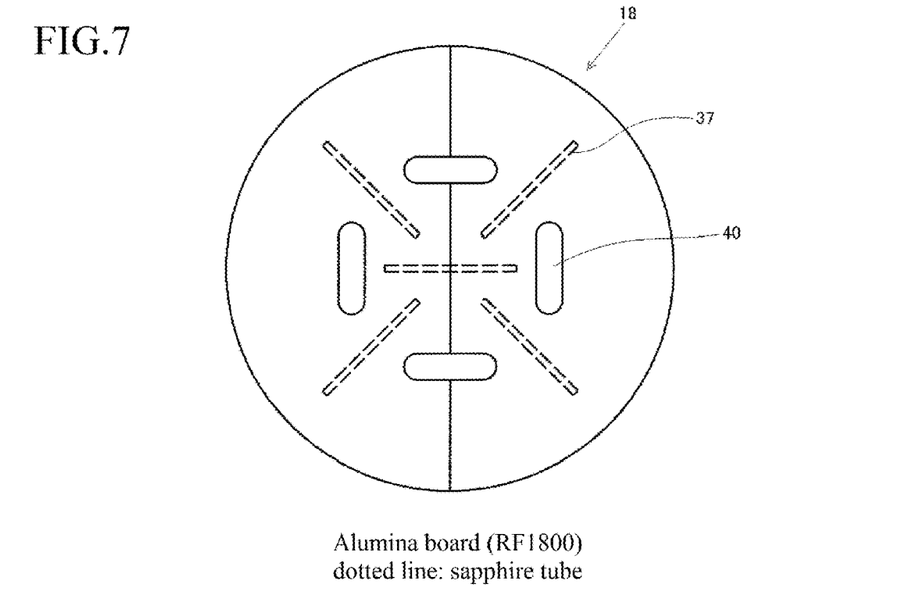
FIG. 7 is a plan view showing an example of the lid member.

The heater 20 used in the embodiment is a heater 20 having a resistance heater formed of molybdenum disilicide ($MoSi_2$) formed into a U-shape (trade name: Kanthal Super). Four heaters 20 are fixed to a supporting member 38 having a frame shape, as shown in FIG. 6, and mounted on the furnace body 14. Specifically, as shown in FIG. 7, long holes 40 are formed in the lid member 18, through which the heaters 20 are inserted, and the heaters 20 are inserted to the long holes 40 and disposed in such a manner that the heaters 20 are positioned to surround the crucible 30 in the furnace body 14. The position of the heater 20 that is inserted to the long hole 40 has a high temperature, and thus a gap is formed at the position to prevent the heater 20 from being in direct contact with the long hole 40.

The supporting member 38 is fixed to an appropriate position (which is not shown in the figure) of the furnace body 14.

In a space between the supporting member 38 and the lid member 18, the same thermal insulator formed of alumina fiber as used in the thermal insulator layer 35 is filled to provide a thermal insulator layer 41.

Kanthal Super (trade name) formed of molybdenum disilicide is capable of heating to a high temperature up to approximately 1900° C., and the heating temperature can be controlled by controlling the electric power fed to the heater 20. In addition to Kanthal Super (trade name), Keramax (trade name) heater is also capable of heating to a high temperature.

The apparatus 10 for producing a gallium oxide crystal according to the embodiment is constituted in the aforementioned manner, and is capable of growing a gallium oxide crystal according to the ordinary vertical Bridgman method in the air. By using the crucible 30 formed of a Pt-based alloy material, particularly Pt—Rh-based alloy material, as the crucible 30, the crucible 30 can be prevented from being oxidized even in the air atmosphere, as different from the case using Ir solely, and the crystal growth can be performed in the air rich in oxygen, thereby growing a gallium oxide crystal without oxygen defects.

While the embodiment uses a resistance heater as a heater for performing resistance heating, a high-frequency induction heating system may be used as the heater.

Figure 8:
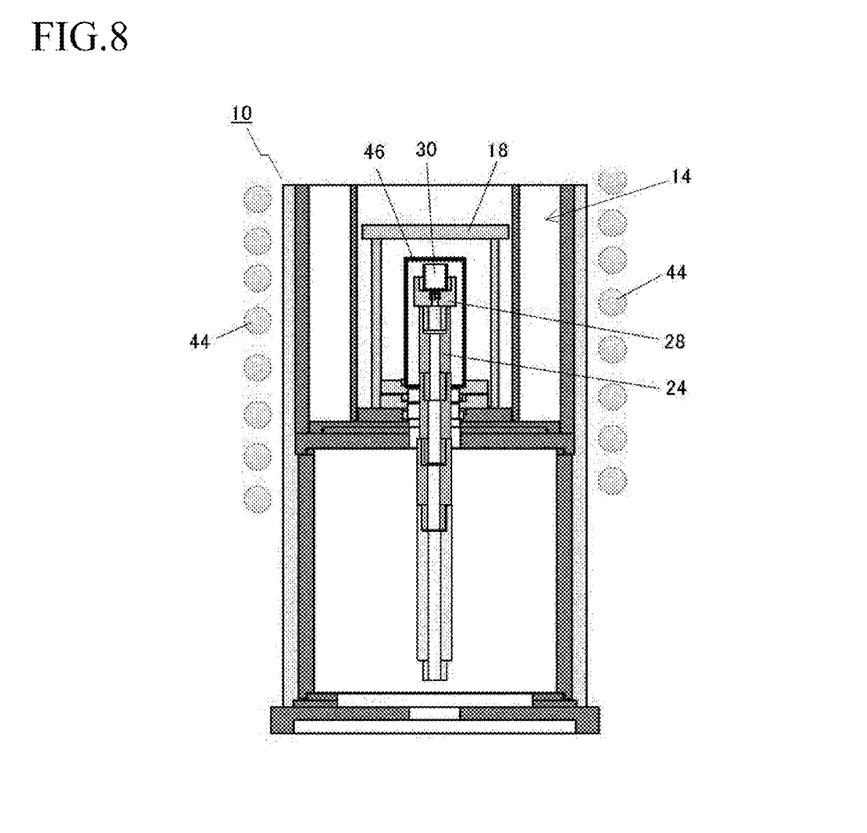
FIG. 8 is a schematic illustration of an example of the apparatus for producing a gallium oxide crystal using a high-frequency induction heating system.

FIG. 8 is a schematic illustration of an example of the apparatus 10 for producing a gallium oxide crystal using a high-frequency induction heating system.

The furnace body 14 shown in FIG. 8 is slightly different from FIG. 3 apparently in the figures, but is actually the same as shown in FIGS. 3 to 7.

What is different in this embodiment includes a high-frequency coil 44 that is disposed outside the furnace body 14, and a heater 46 heating by high-frequency induction heating that is disposed instead of the resistance heater 20 in the previous embodiment. The heater 46 used is preferably a heater formed of a Pt-based alloy material, particularly a Pt—Rh-based alloy material. The use of the crucible formed of a Pt—Rh-based alloy having a Rh content of from 10 to 30 wt % is preferred as the crucible material used for growing a gallium oxide crystal by the VB method, as described above, and the material for the heater 46 is preferably a Pt—Rh-based alloy material having a Rh content of approximately 30 wt %, i.e., rich in Rh, which withstands a higher temperature than the crucible 30. The apparatus 10 for producing a gallium oxide crystal according to the embodiment is also capable of growing a gallium oxide crystal without oxygen defects by the VB method in the air while preventing the oxidation of the crucible 30.

A melting and solidification experiment of $\beta$-$Ga_2O_3$ as a raw material will be shown. Melting and Solidification Experiment of $\beta$-$Ga_2O_3$ I By using the production apparatus 10 shown in FIG. 8, a $\beta$-$Ga_2O_3$ raw material is placed in the crucible 30, and a melting experiment of $\beta$-$Ga_2O_3$ is performed. The crucible used is a Pt—Rh alloy (Pt/Rh: 90/10 wt %) vessel.

Figure 9:
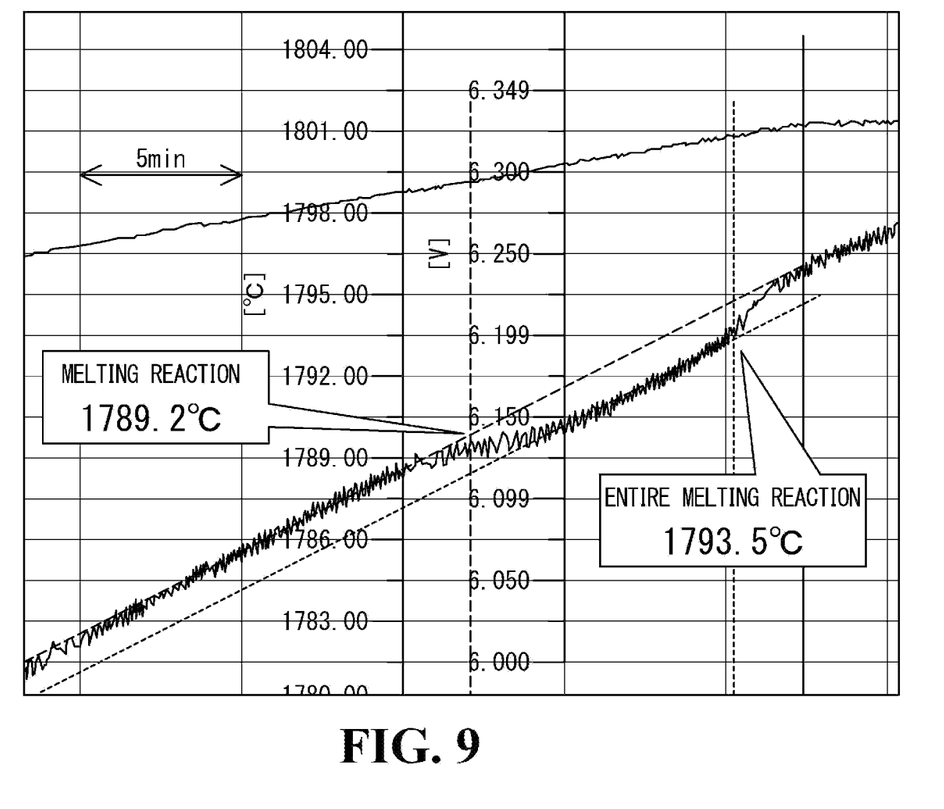
FIG. 9 is a graph showing the actually measured data of the temperature profile of the crucible in the case where $\beta$-$Ga_2O_3$ is placed in the crucible, and the temperature of the crucible is increased.

FIG. 9 is a graph showing the actually measured data of the temperature profile of the crucible 30 by using the apparatus 10 in the case where the $\beta$-$Ga_2O_3$ raw material is placed in the crucible, and the temperature of the interior of the furnace body 14 is gradually increased from room temperature. FIG. 9 also shows the elapsed time on increasing the temperature.

The temperature profile shown in FIG. 9 shows that while the constant temperature increasing rate appears from room temperature, the temperature increasing rate once slows down at 1789.2° C. to retard the temperature increase, and thereafter the original temperature increasing rate is restored at 1793.5° C. Thus, 1789.2° C. where the temperature increasing rate starts to slow down is the temperature, at which the $\beta$-$Ga_2O_3$ material starts to melt, and 1793.5° C. where the original temperature increasing rate is restored is the temperature, at which the $\beta$-$Ga_2O_3$ material is completely melted in the crucible.

Figure 10:
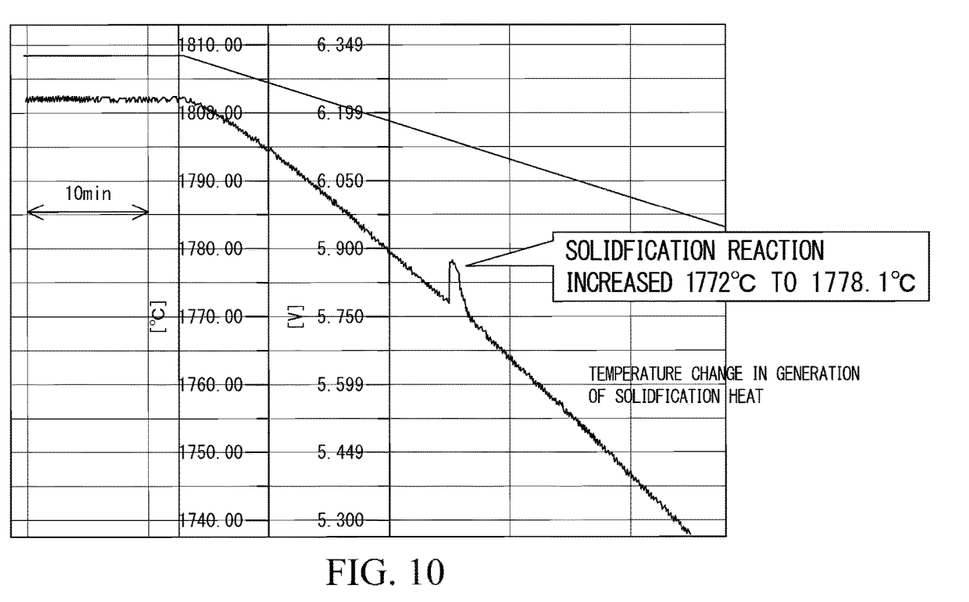
FIG. 10 is a graph showing the actually measured data of the temperature profile in the case where after melting $\beta$-$Ga_2O_3$ in the crucible, the temperature of the crucible is gradually decreased.

FIG. 10 is a graph showing the actually measured data of the temperature profile in the case where after heating the crucible to 1800° C. or more (1802° C.), the temperature of the crucible is gradually decreased. The temperature profile shows that at the time after the temperature is decreased to 1772.2° C., the temperature is quickly increased from 1772.2° C. to 1778.1° C. The temperature change occurs due to the heat generated by the solidification of the molten $\beta$-$Ga_2O_3$. Thus, it is shown that molten $\beta$-$Ga_2O_3$ is solidified at 1772.2° C., and in other words, $\beta$-$Ga_2O_3$ placed in the crucible is entirely melted and then solidified.

Figure 11A:
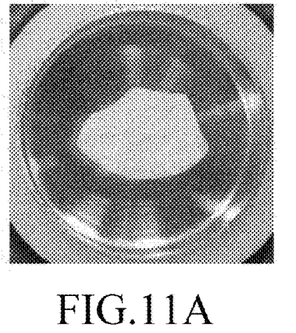
FIGS. 11A and 11B are photographs showing the states of the $\beta$-$Ga_2O_3$ material before heating (FIG. 11A) and after melting and solidification (FIG. 11B).
Figure 11B:
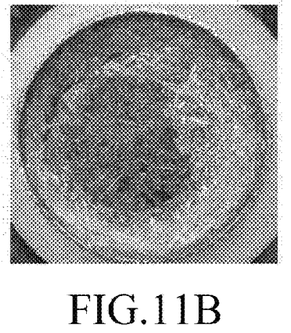

FIGS. 11A and 11B are photographs showing the $\beta$-$Ga_2O_3$ raw material placed in the crucible before heating (FIG. 11A) and after melting and solidification (FIG. 11B). FIG. 11A shows the state where a bulk $\beta$-$Ga_2O_3$ material is placed in the crucible. FIG. 11B shows that the $\beta$-$Ga_2O_3$ material is entirely melted to fill the crucible fully, and then solidified.

The melting and solidification experiment of $\beta$-$Ga_2O_3$ shown in FIG. 9 is performed with precise temperature measurement, and is important in the points that the melting temperature of $\beta$-$Ga_2O_3$ is accurately determined, and $\beta$-$Ga_2O_3$ is entirely melted and solidified in the crucible.

As for the melting point of $\beta$-$Ga_2O_3$, various values have been reported within a range of from 1650 to 1800° C. In the melting experiment, the temperature, at which the $\beta$-$Ga_2O_3$ material starts to melt, i.e., 1789.2° C., and the temperature, at which the $\beta$-$Ga_2O_3$ material is completely melted in the crucible, i.e., 1793.5° C., are actually measured, and thus the experiment firstly identifies the melting temperature of $\beta$-$Ga_2O_3$ accurately. Accordingly, a $\beta$-$Ga_2O_3$ crystal can be reliably grown by selecting the material for the crucible, and controlling the temperature for the crystal growth, based on the melting temperature of $\beta$-$Ga_2O_3$ that has been derived from the melting experiment.

Figure 12A:
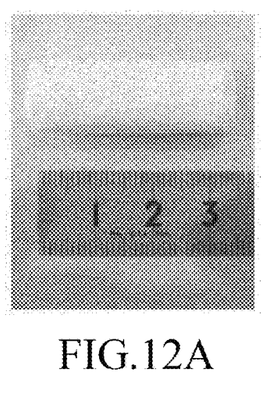
FIGS. 12A, 12B, and 12C are photographs showing the melting experiment of $\beta$-$Ga_2O_3$ using a Pt—Rh alloy crucible having a ratio Pt/Rh of 70/30 wt %.
Figure 12B:
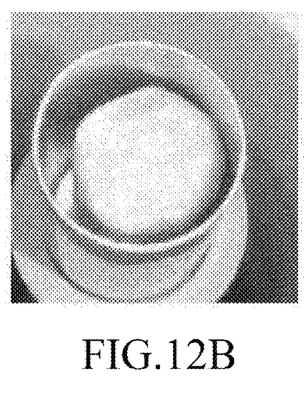
Figure 12C:
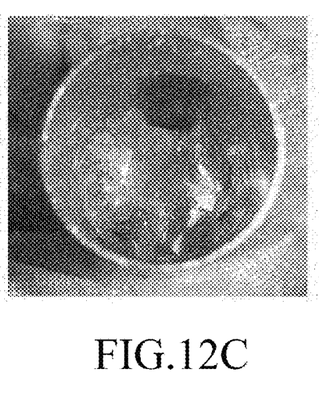

In the melting experiment, the crucible used is a Pt—Rh alloy (Pt/Rh: 90/10 wt %) vessel. The result of the experiment shows that a $\beta$-$Ga_2O_3$ crystal can be produced by using a Pt—Rh alloy (Pt/Rh: 90/10 wt %) vessel.
Melting Experiment of $\beta$-$Ga_2O_3$ II FIGS. 12A, 12B, and 12C are photographs showing another example of the melting experiment of $\beta$-$Ga_2O_3$. In the melting experiment, $\beta$-$Ga_2O_3$ is melted by using a Pt—Rh alloy having a ratio Pt/Rh of 70/30 wt % as a crucible.

FIG. 12A shows the $\beta$-$Ga_2O_3$ raw material used in the experiment. The raw material used is a cylindrical sintered material of $\beta$-$Ga_2O_3$.

FIG. 12B shows the state where the $\beta$-$Ga_2O_3$ raw material is placed (in which the $\beta$-$Ga_2O_3$ raw material is housed in a vertically standing manner).

FIG. 12C shows the state of the crucible after increasing the crucible temperature to approximately from 1800 to 1860° C. and then decreasing to room temperature. The $\beta$-$Ga_2O_3$ raw material is entirely melted and solidified.

The result of the experiment shows that a Pt—Rh alloy crucible having a ratio Pt/Rh of 70/30 wt % can be sufficiently used for crystal growth of $\beta$-$Ga_2O_3$.

Both the melting experiment I and the melting experiment II are performed in the air (oxidative atmosphere). The results of the experiments show that crystal growth of $\beta$-$Ga_2O_3$ can be performed in the air by using a crucible vessel formed of a Pt—Rh alloy.
Melting Experiment of $\beta$-$Ga_2O_3$ III A melting experiment of $\beta$-$Ga_2O_3$ is performed with the production apparatus 10 described above. A crucible of a Pt—Rh alloy vessel having a ratio of Pt/Rh of 90/10 wt % is used. The melting experiment is to observe the state where the temperature for heating the crucible is increased to a significantly higher temperature range than the melting temperature of $\beta$-$Ga_2O_3$.

Figure 13A:
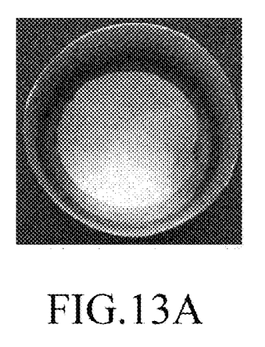
FIGS. 13A and 13B are photographs showing the melting experiment of $\beta$-$Ga_2O_3$ using a Pt—Rh alloy crucible having a ratio Pt/Rh of 90/10 wt %.
Figure 13B:
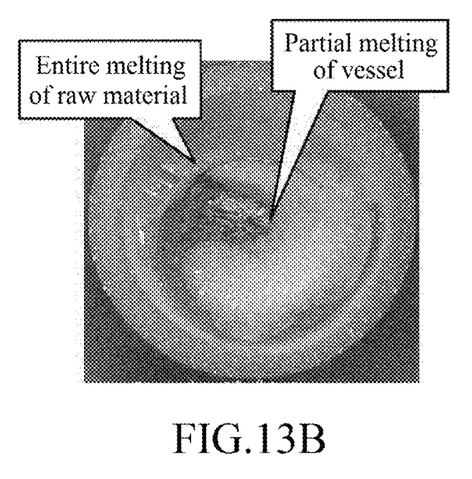

FIG. 13A shows the state where a bulk sintered material of $\beta$-$Ga_2O_3$ is placed in the crucible before heating. FIG. 13B shows the state where the crucible is heated to the melting temperature of $\beta$-$Ga_2O_3$ or more and then decreased to room temperature.

In this experiment, it is expected that the crucible is heated to approximately from 1800 to 1860° C., and thereby the raw material of $\beta$-$Ga_2O_3$ is entirely melted, whereas the crucible is also partially melted.

It is considered that the reason why the crucible is partially melted is that the temperature of the crucible exceeds 1850° C., which is the melting point of a Pt—Rh alloy (Pt/Rh: 90/10 wt %).

Therefore, in the case where crystal growth of $\beta$-$Ga_2O_3$ is performed by using a Pt—Rh alloy (Pt/Rh: 90/10 wt %) as the material for the crucible, it is naturally necessary to control the temperature to perform the crystal growth at the temperature, at which the crucible is melted, or less.
Melting Experiment of $\beta$-$Ga_2O_3$ IV The aforementioned melting experiments of $\beta$-$Ga_2O_3$ are experiments, in which a $\beta$-$Ga_2O_3$ raw material is melted by using the production apparatus 10 shown in FIG. 8 in the air (oxidative atmosphere). As a comparative example, an experiment is performed, in which a $\beta$-$Ga_2O_3$ raw material is melted by using a growing furnace having an argon gas atmosphere.

In the crystal growth furnace having an argon gas atmosphere, a carbon heater is disposed outside a crucible, the crucible and a part of a supporting member of the crucible are airtightly shielded with the carbon heater and a thermal insulating material, and the crucible is heated while flowing argon gas in a region having the crucible housed therein.

The crucible used in the melting experiment is a Pt—Rh alloy (Pt/Rh: 90/10 wt %) crucible.

Figure 14:
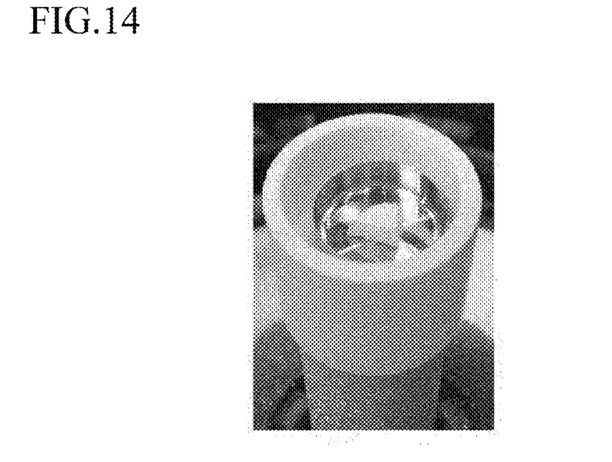
FIG. 14 is a photograph showing the melting experiment of $\beta$-$Ga_2O_3$ using a Pt—Rh alloy crucible having a ratio Pt/Rh of 90/10 wt % performed in an argon gas atmosphere.

FIG. 14 shows the state where a $\beta$-$Ga_2O_3$ raw material is placed in the crucible. In the case where the crucible is heated to 1700° C., and then cooled to room temperature, in an argon atmosphere, the $\beta$-$Ga_2O_3$ raw material is lost, and the crucible vessel is melted (which are not shown in the figure). The phenomenon shows that $Ga_2O_3$ is reductively decomposed by heating the crucible to 1700° C. in an argon atmosphere, and Ga metal and the Pt—Rh alloy of the crucible form an alloy having a lower melting temperature, which is melted at 1700° C.

The result of the experiment shows that in the case where a $\beta$-$Ga_2O_3$ raw material is melted in a crucible, it is necessary to perform crystal growth of $\beta$-$Ga_2O_3$ in an oxidative atmosphere since the reductive decomposition of $Ga_2O_3$ proceeds in a high temperature range, in which $\beta$-$Ga_2O_3$ is melted, to prevent $\beta$-$Ga_2O_3$ from being present as a stable melt. Example of Crystal Growth of $\beta$-$Ga_2O_3$ Crystal growth of $\beta$-$Ga_2O_3$ by unidirectional solidification without seed was tried to perform in a VB furnace.

A $\beta$-$Ga_2O_3$ sintered material as a raw material was charged in a crucible formed of a Pt—Rh-based alloy having an inner diameter of 25 mm and a height of 50 mm, and entirely melted in an air high temperature furnace (i.e., the apparatus shown in FIG. 8) at 1800° C. or more, the temperature distribution of which was set to make the temperature gradient of from 5 to 10° C./cm around the melting point of $\beta$-$Ga_2O_3$ (approximately 1795° C.). Thereafter, unidirectional solidification was performed by a combination of the movement of the crucible and the decrease of the temperature in the furnace. After cooling, the crucible was released, and a grown crystal was taken out.

Figure 15:
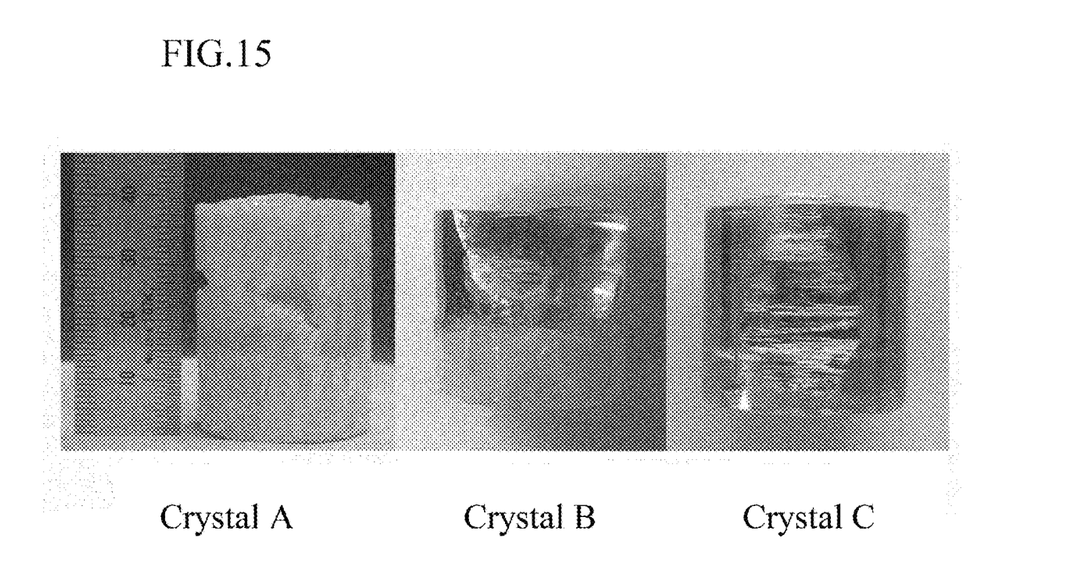
FIG. 15 is a photograph showing the three kinds of typical crystals that undergo unidirectional solidification in the crucible.

FIG. 15 is a photograph of crystals showing the three kinds of typical crystals obtained by the crystal growth of $\beta$-$Ga_2O_3$ by unidirectional solidification. The crystal A shows the case where the entire material undergoes polycrystalline growth. The crystal B shows the case where polycrystalline growth is quickly transferred to single crystal growth. The crystal C shows the case where single crystal growth occurs from the bottom to the top end. The X-ray diffraction and observation of characteristic crystal habits identified that both the single crystal portion of the crystal B and the single crystal C underwent facet growth of the (100) plane in the <100> direction, and that a (001) facet plane appeared at approximately 104° with respect to the (100) plane, and the direction perpendicular to the two facet planes was the <010> direction. It was confirmed that the (100) plane facet growth in the <100> direction occurred with a high probability without seed due to the strong anisotropy in growing rate, in which the growing rate in the <010> direction was larger by approximately one order of magnitude than in the <100> direction.

Figure 16A:
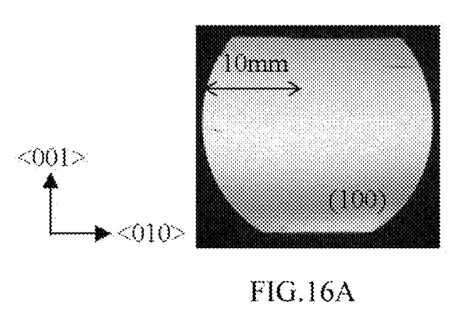

From the resulting single crystal, a (100) plane substrate perpendicular to the growth direction was cut out to provide a double-sided mirror polished substrate having a thickness of approximately 0.5 mm. The substrate specimen was subjected to crossed nicols observation, X-ray topography observation, and optical microscope observation after etching with KOH.

Figure 16B:
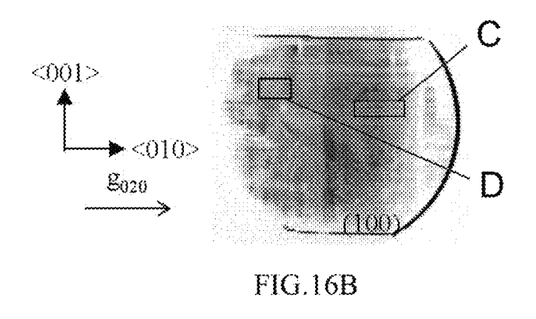
Figure 16C:
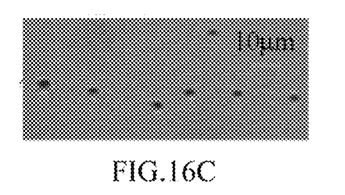
Figure 16D:
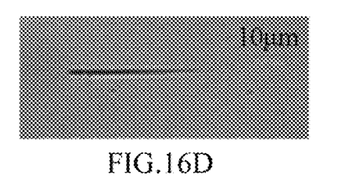

FIG. 16A shows the result of the crossed nicols observation. The observation revealed that the substrate was a single crystal substrate without a detectable low angle tilt boundary. FIG. 16B shows the transmission X-ray topograph of the same substrate. A transmission X-ray diffraction pattern was obtained except for a part of the outer periphery. The part of the outer periphery lacking the pattern (white portion) corresponds to a high dislocation density region or a slight tilt angle that cannot be detected by the crossed nicols method. FIG. 16C (enlargement of area C of FIG. 16B) shows the dislocation pit line that is locally aligned substantially in the <010> direction. The pits had a density of approximately $1 \times 10^4$ per square centimeter. The region corresponding to the white portion in the X-ray topograph shown in FIG. 16B had dislocation pits in a high density of approximately $5 \times 10^5$ per square centimeter. FIG. 16D (enlargement of area D of FIG. 16B) shows the defects that are linearly aligned in a size of from 10 µm to several tens micrometers in the <010> direction that do not correspond to the X-ray topograph. The defects are observed without etching and are considered to be linear defects.

Figure 17:
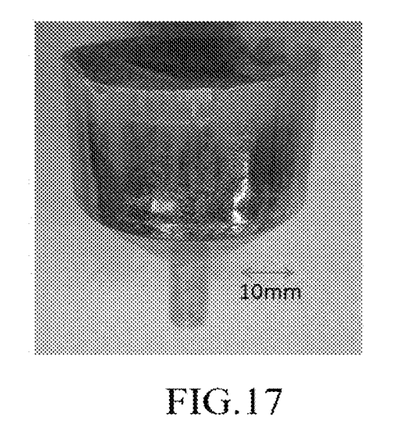
FIG. 17 is a photograph of the $\beta$-$Ga_2O_3$ crystal grown with a Pt/Rh ratio of 80/20 wt % alloy crucible having an inner diameter of 2 inch using the resistance heating large scale atmospheric furnace shown in FIG. 3.

FIG. 17 is a photograph of the crystal grown with a Pt/Rh ratio of 80/20 wt % alloy crucible having an inner diameter of 2 inch using the resistance heating large scale atmospheric furnace shown in FIG. 3. In this example, a $\beta$-$Ga_2O_3$ sintered material as a raw material was charged in the crucible, entirely melted, and then solidified from the lower part (thin portion), and a $\beta$-$Ga_2O_3$ crystal having a diameter of 2 inch was grown although the crystal was not a complete single crystal.

What is claimed is:

1. An apparatus for producing a gallium oxide crystal, comprising a vertical Bridgman furnace containing: a base body; a cylindrical furnace body having heat resistance disposed above the base body; a lid member occluding the furnace body; a heater disposed inside the furnace body; a crucible shaft provided vertically movably through the base body; and a crucible disposed on the crucible shaft, heated with the heater,
    the crucible being a Pt—Rh-based alloy crucible having a Rh content of from 10 to 30 wt % and the crucible having heat resistance withstanding a high temperature from 1800° C. to 1900° C.,
    the vertical Bridgman furnace being a high temperature furnace heatable at from 1800° C. to 1850° C. under an oxygen atmosphere, the furnace body having an inner wall that is formed as a heat-resistant inner wall containing plural ring shaped heat-resistant members each having a prescribed height accumulated on each other, the ring shaped heat-resistant members each containing plural divided pieces that are joined to each other to a ring shape, and
    wherein the lid member contains a plurality of boards accumulated, each of which is formed of aggregated alumina fibers and a reinforcing member formed of a sapphire tube being inserted into the accumulated boards.

2. The apparatus for producing a gallium oxide crystal according to claim 1, wherein the heat-resistant inner wall contains zirconia.

3. The apparatus for producing a gallium oxide crystal according to claim 1, wherein the heater is a resistance heater containing $MoSi_2$ as a major material.

4. The apparatus for producing a gallium oxide crystal according to claim 1, wherein the heater is a high-frequency induction heater.

5. The apparatus for producing a gallium oxide crystal according to claim 4, wherein the high-frequency induction heater contains a Pt—Rh-based alloy.

6. The apparatus for producing a gallium oxide crystal according to claim 1, wherein the furnace body contains a supporting cylinder member formed of a heat-resistant material and disposed outside the heat-resistant inner wall, and a thermal insulator disposed between the heat-resistant inner wall and the supporting cylinder member, and the lid member is supported by the supporting cylinder member.

* * * * *